(12) United States Patent
Lee

(10) Patent No.: US 11,032,927 B2
(45) Date of Patent: Jun. 8, 2021

(54) LATCH MECHANISM AND TENON STRUCTURE THEREOF

(71) Applicant: Getac Technology Corporation, Hsinchu County (TW)

(72) Inventor: Kun-Cheng Lee, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 504 days.

(21) Appl. No.: 16/158,616

(22) Filed: Oct. 12, 2018

(65) Prior Publication Data

US 2020/0120819 A1 Apr. 16, 2020

(51) Int. Cl.
*H05K 5/02* (2006.01)
*H05K 5/03* (2006.01)
*F16B 5/06* (2006.01)

(52) U.S. Cl.
CPC ............. *H05K 5/0221* (2013.01); *F16B 5/06* (2013.01); *H05K 5/03* (2013.01)

(58) Field of Classification Search
CPC ................................ H05K 5/0221; F16B 5/06
See application file for complete search history.

(56) References Cited

U.S. PATENT DOCUMENTS

| | | | |
|---|---|---|---|
| 2014/0368994 A1* | 12/2014 | Lee | H05K 5/061 361/679.55 |
| 2015/0047262 A1* | 2/2015 | Lee | H05K 5/061 49/394 |
| 2015/0173217 A1* | 6/2015 | Mao | H05K 7/1411 312/332.1 |
| 2017/0254119 A1* | 9/2017 | Raz | E05B 65/06 |
| 2017/0340078 A1* | 11/2017 | Huang | A45C 13/008 |
| 2018/0080258 A1* | 3/2018 | Yuan | E05C 9/04 |
| 2018/0220544 A1* | 8/2018 | Wang | G11B 33/124 |
| 2019/0024406 A1* | 1/2019 | Zhang | H05K 5/03 |
| 2019/0069446 A1* | 2/2019 | Chang | H05K 7/20736 |
| 2019/0263558 A1* | 8/2019 | Plant | B29C 49/0031 |
| 2020/0253078 A1* | 8/2020 | Yu | H05K 7/1489 |
| 2020/0263452 A1* | 8/2020 | Raz | E05B 47/0001 |
| 2020/0337164 A1* | 10/2020 | Lee | E05B 17/002 |

* cited by examiner

*Primary Examiner* — Hung V Ngo

(74) *Attorney, Agent, or Firm* — Locke Lord LLP; Tim Tingkang Xia, Esq.

(57) ABSTRACT

The present invention relates to a latch mechanism and a tenon structure thereof. The tenon structure includes a trigger portion and a fastening rail portion adapted to be respectively installed at a hollow opening and a side edge of a sliding cover plate to accordingly achieve a single-piece tenon structure. The tenon structure is connected to the sliding cover plate, moves in a second direction along with the sliding cover plate, and is capable of displacing in a first direction relative to the sliding cover plate. The tenon structure includes a front latch portion and a trigger portion exposed at the sliding cover plate, so as to achieve effects of a simple assembly structure and reduced production costs.

10 Claims, 14 Drawing Sheets

LATCH MECHANISM AND TENON STRUCTURE THEREOF

BACKGROUND OF THE INVENTION

Field of the Invention

The present invention relates to a latch structure and a tenon structure thereof applied for opening, closing, unlocking and locking an entry on an electronic device and more particularly, to a single-piece tenon structure and a latch mechanism having the structure.

Description of the Prior Art

Current electronic devices such as portable personal computers are mostly equipped with expansion and upgrading functions, allowing consumers to expand certain peripheral hardware devices according to desired requirements, e.g., installing an additional battery, a hard drive or an optical drive. Thus, to provide consumers with space for subsequent upgrading and expansion devices, the industry has launched some models for users to voluntarily expand hardware devices.

In such type of electronic device with expansion and upgrading functions, a large space is usually reserved in a casing of a host for consumers to perform related assembly and utilization as desired. Using a latch mechanism, an entry of the above space can be opened, closed, unlocked or locked to prevent dust or other foreign objects from entering the above space via the entry, or to prevent expanded peripheral hardware devices from falling out of the space.

However, a common latch mechanism, for example, the U.S. Patent Publication No. 20120144749, has following drawbacks. First of all, the number of constituting components thereof is rather large, leading to complicated assembly and a larger accommodation space, such that multiple molds need to be developed and production costs are increased. Secondly, a structure for preventing a cover plate from being opened is not designed in the above solution, and a cover plate can be easily opened in case of unintentional trigger, vibration or collision, depriving the cover plate from the entry closing or locking function.

In view of the above, with respect to the above prior art, as an object of the Applicant, the Applicant has dedicated to related researches incorporating with the application of theories to resolve the foregoing issues.

SUMMARY OF THE INVENTION

The present invention provides a latch mechanism and a tenon structure thereof. An additional tenon structure is installed and components of the tenon structure are simplified, so as to achieve effects of preventing a sliding cover plate from being opened due to unintentional trigger, vibration or collision, providing a simple assembly structure, reducing accommodation space and reducing production costs.

According to an embodiment of the present invention, a tenon structure is provided by the present invention. The tenon structure is adapted to be assembled to a hollow opening and a side edge of a sliding cover plate. The tenon structure includes a body; a trigger portion extending from the body and provided correspondingly to the hollow opening; and a fastening rail portion extending from the body and provided correspondingly to the side edge. The tenon structure utilizes the trigger portion and the fastening rail portion to respectively abut against and slide at the hollow opening and the side edge of the sliding cover plate.

According to an embodiment of the present invention, the present invention provides a latch mechanism. The latch mechanism includes a frame provided with a fastening groove along a first direction; a sliding cover plate connected to the frame, and capable of displacing along a second direction and moving between a first position and a second position, wherein the second direction is perpendicular to the first direction; and a tenon structure connected to the sliding cover plate. The tenon structure moves in the second direction along with the sliding cover plate, and is capable of displacing in the first direction relative to the sliding cover plate. The tenon structure includes a front latch portion and a trigger portion exposed at the sliding cover plate. When the sliding cover plate moves to the second position, the trigger portion is able to drive the front latch portion along the first direction and to be inserted and fitted in the fastening groove.

On the basis of the above, the sliding cover plate is provided with a hollow opening, and the trigger portion includes a neck portion and a head portion. With the size differences among the neck portion, the head portion and the hollow opening, as well as the simple structure of the trigger portion and the fastening rail portion which respectively abut against and slide at the hollow opening and the side edge of the sliding cover plate, the tenon structure can be guided to drive the front latch portion to be fitted in the fastening groove, achieving objects of locking and keeping the sliding cover plate immobile by the tenon structure and simplifying components of the tenon structure, and accomplishing effects of preventing the sliding cover plate from being opened due to an unintentional trigger, vibration or collision, providing a simple assembly structure, reducing accommodation space and reducing production costs.

DETAILED DESCRIPTION OF THE EMBODIMENTS

Figure 1:
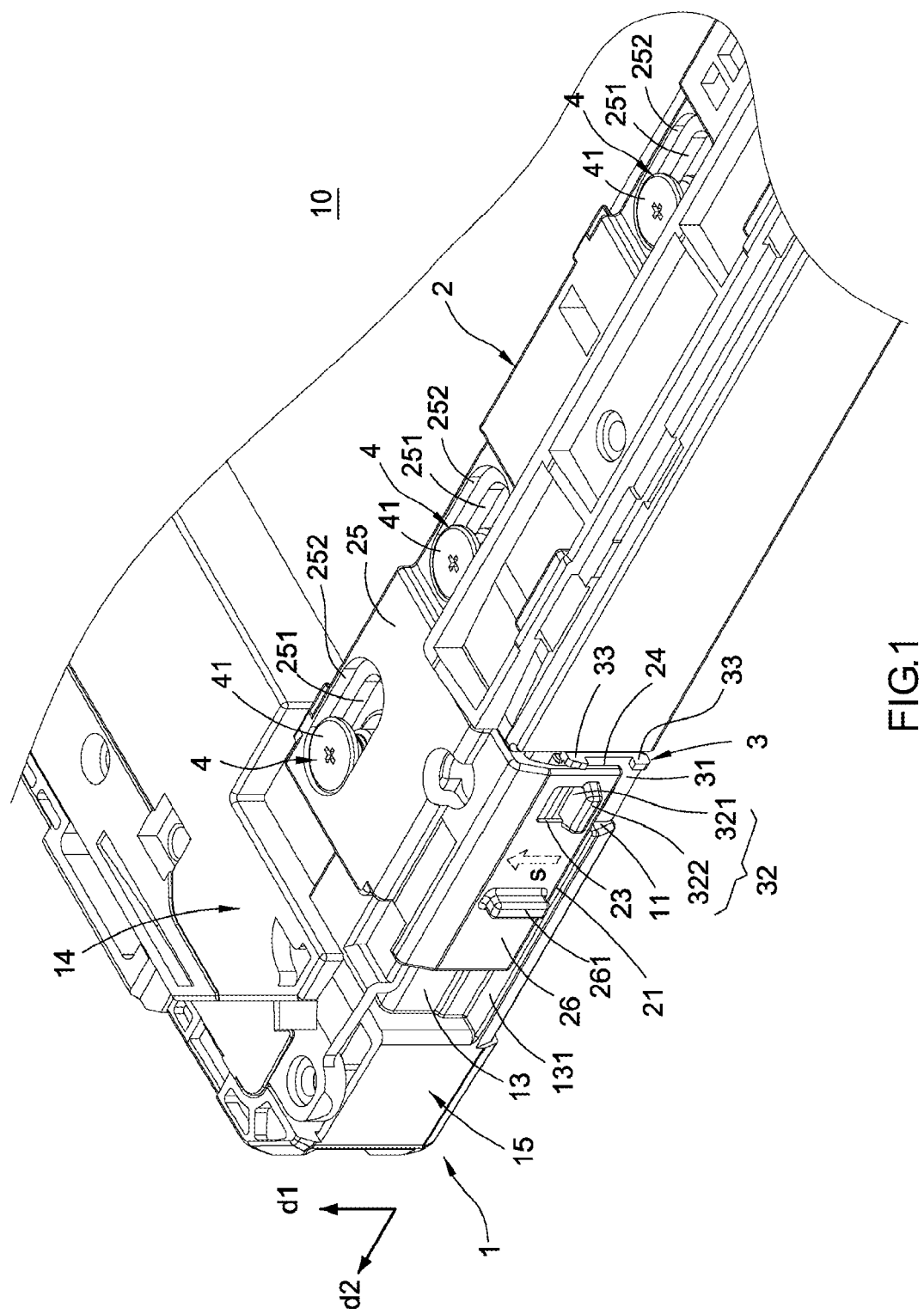
FIG. 1 is a perspective assembly diagram of a latch mechanism according to an embodiment of the present invention.
Figure 2:
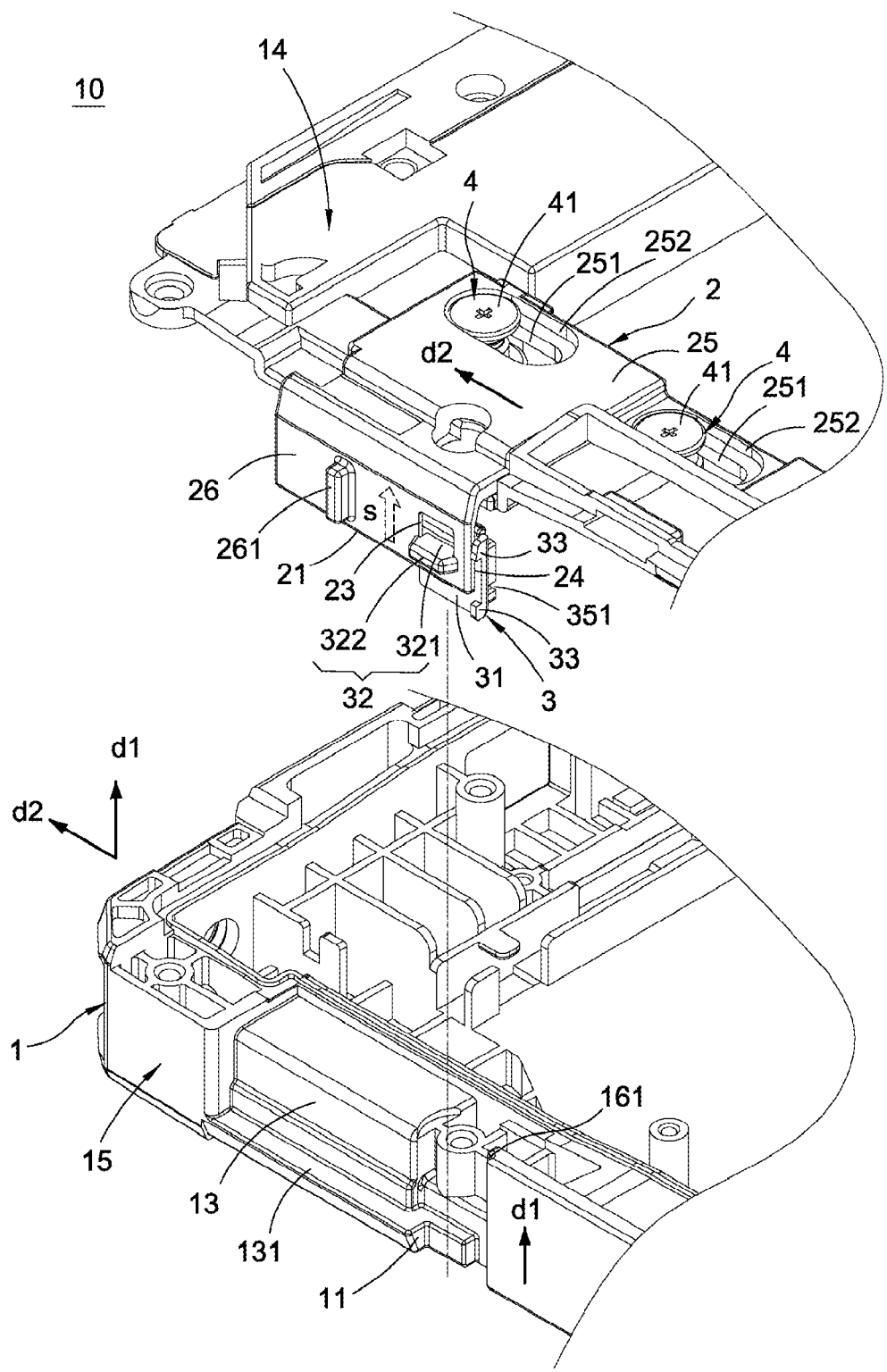
FIG. 2 is an exploded perspective diagram of a latch mechanism according to an embodiment of the present invention.
Figure 3:
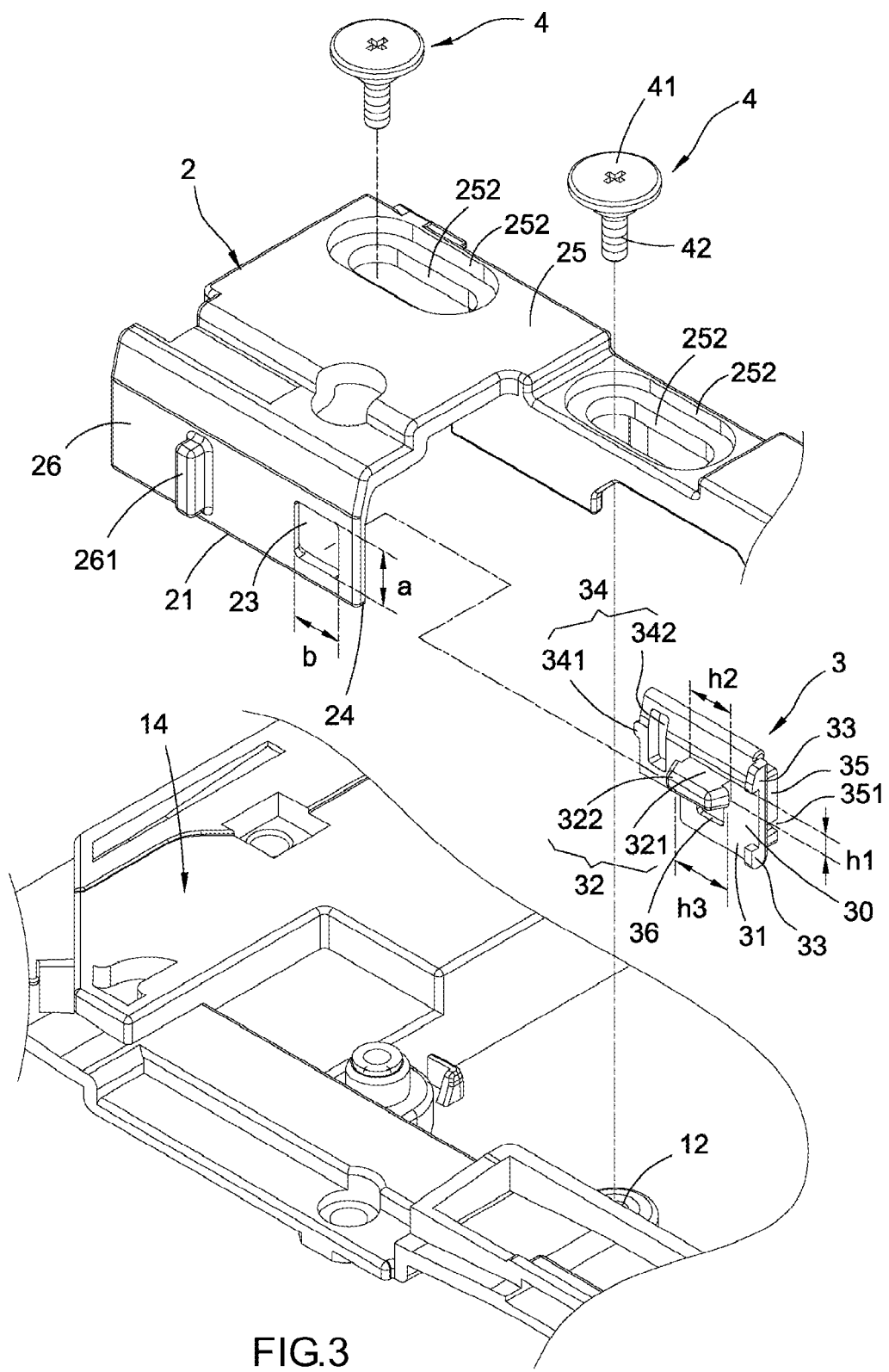
FIG. 3 is another exploded perspective diagram of a latch mechanism according to an embodiment of the present invention.
Figure 4:
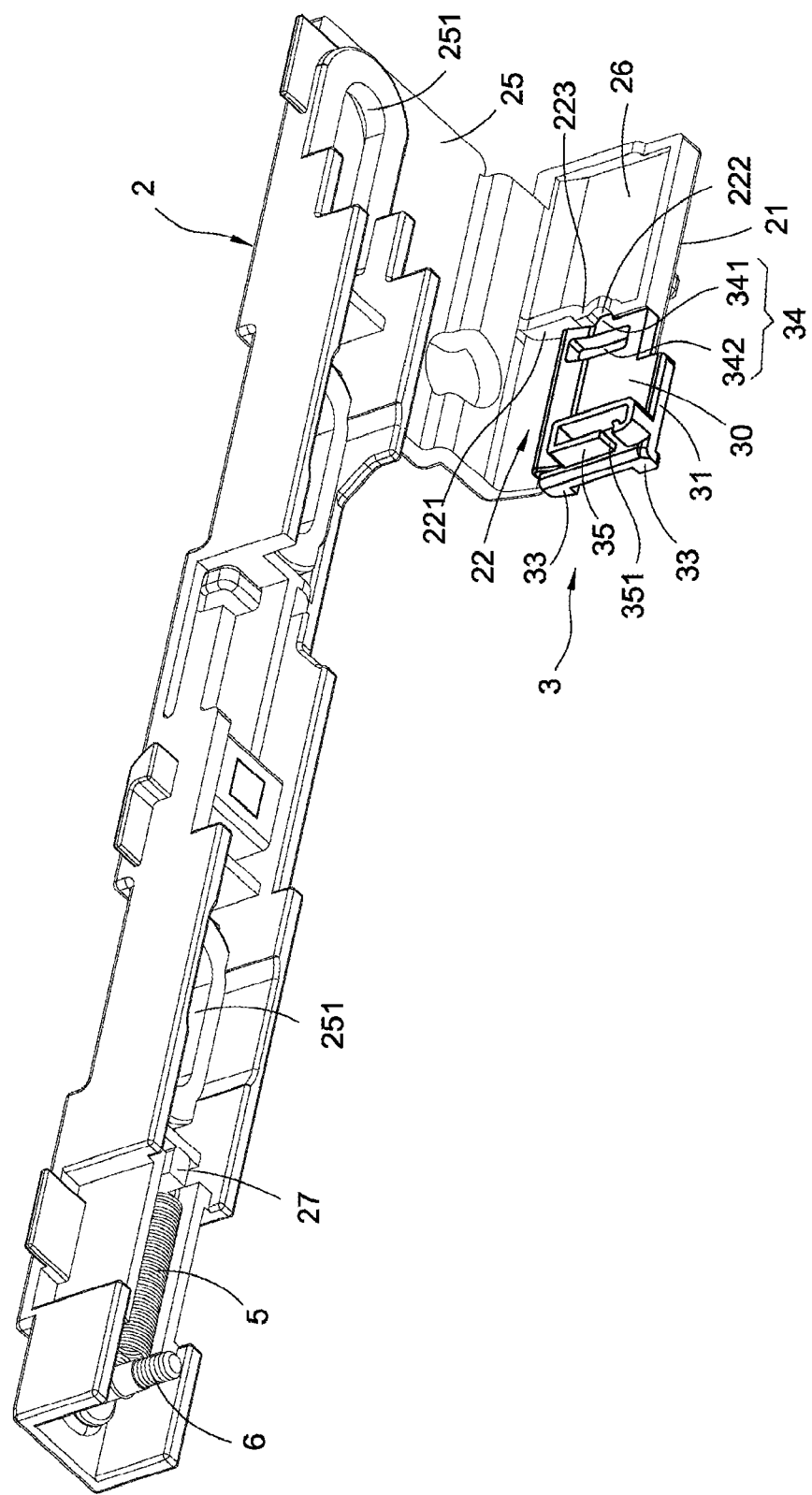
FIG. 4 is a perspective assembly diagram of a sliding cover plate and a tenon structure according to an embodiment of the present invention.
Figure 5:
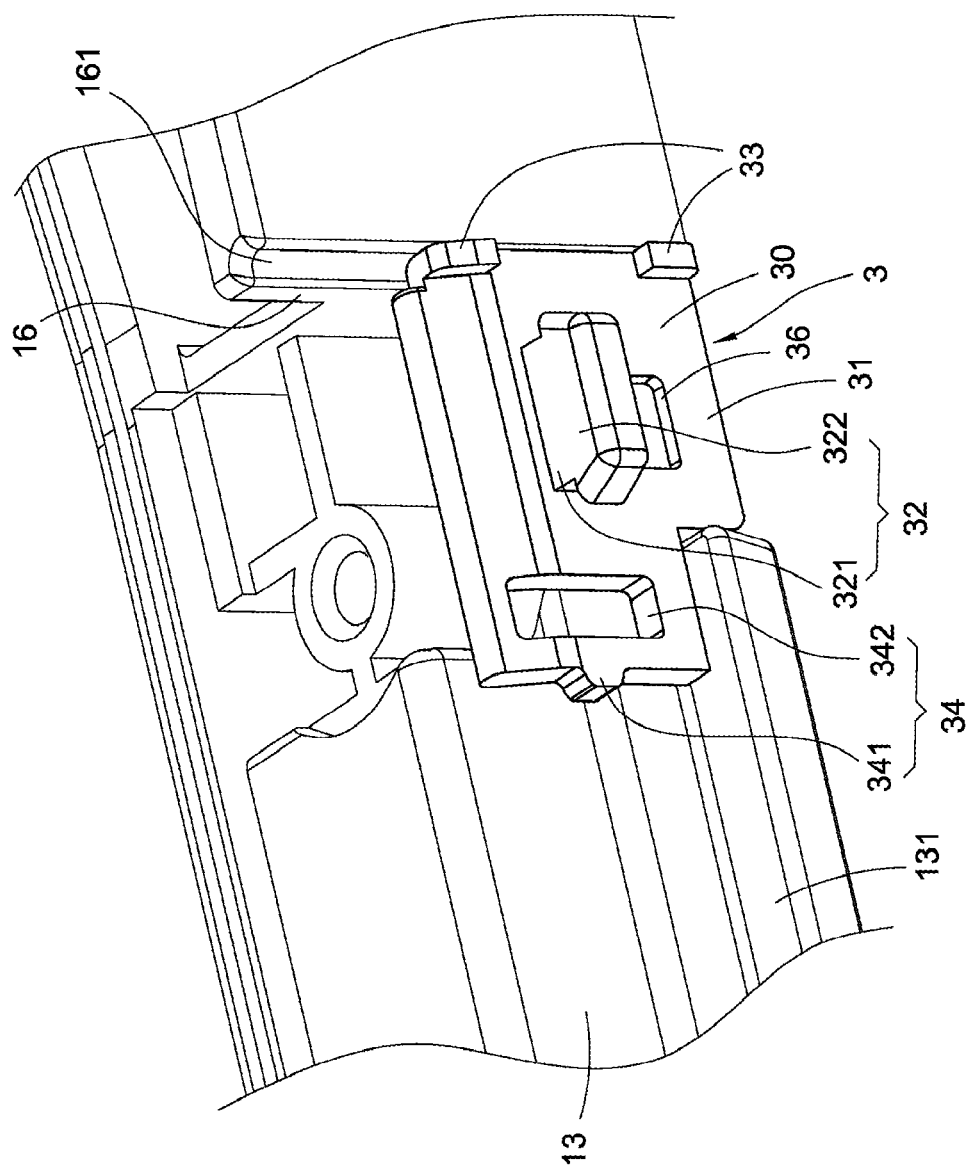
FIG. 5 is a perspective schematic diagram of a tenon structure at a locking position according to an embodiment of the present invention.
Figure 6:
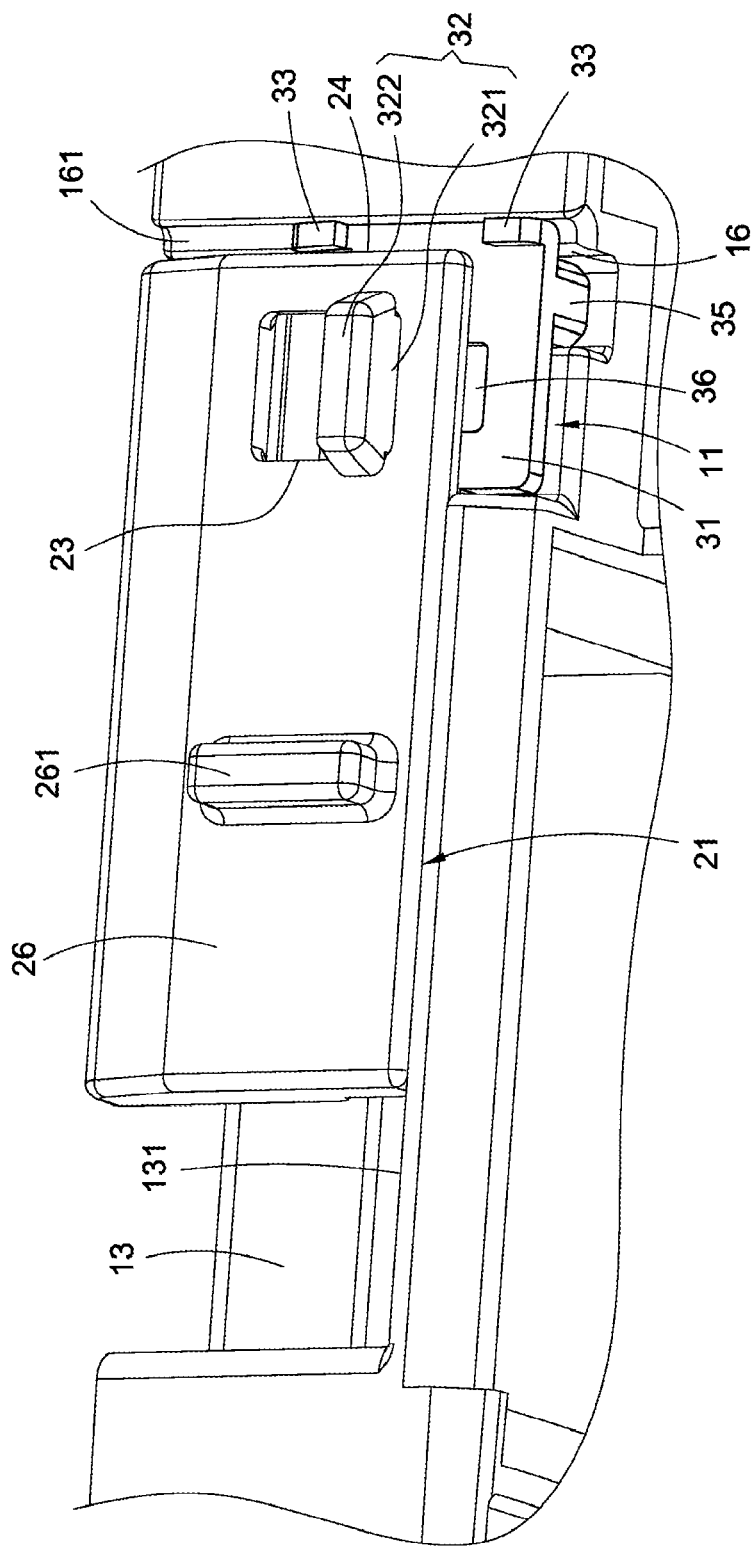
FIG. 6 is another perspective schematic diagram of a tenon structure at a locking position according to an embodiment of the present invention.
Figure 7:
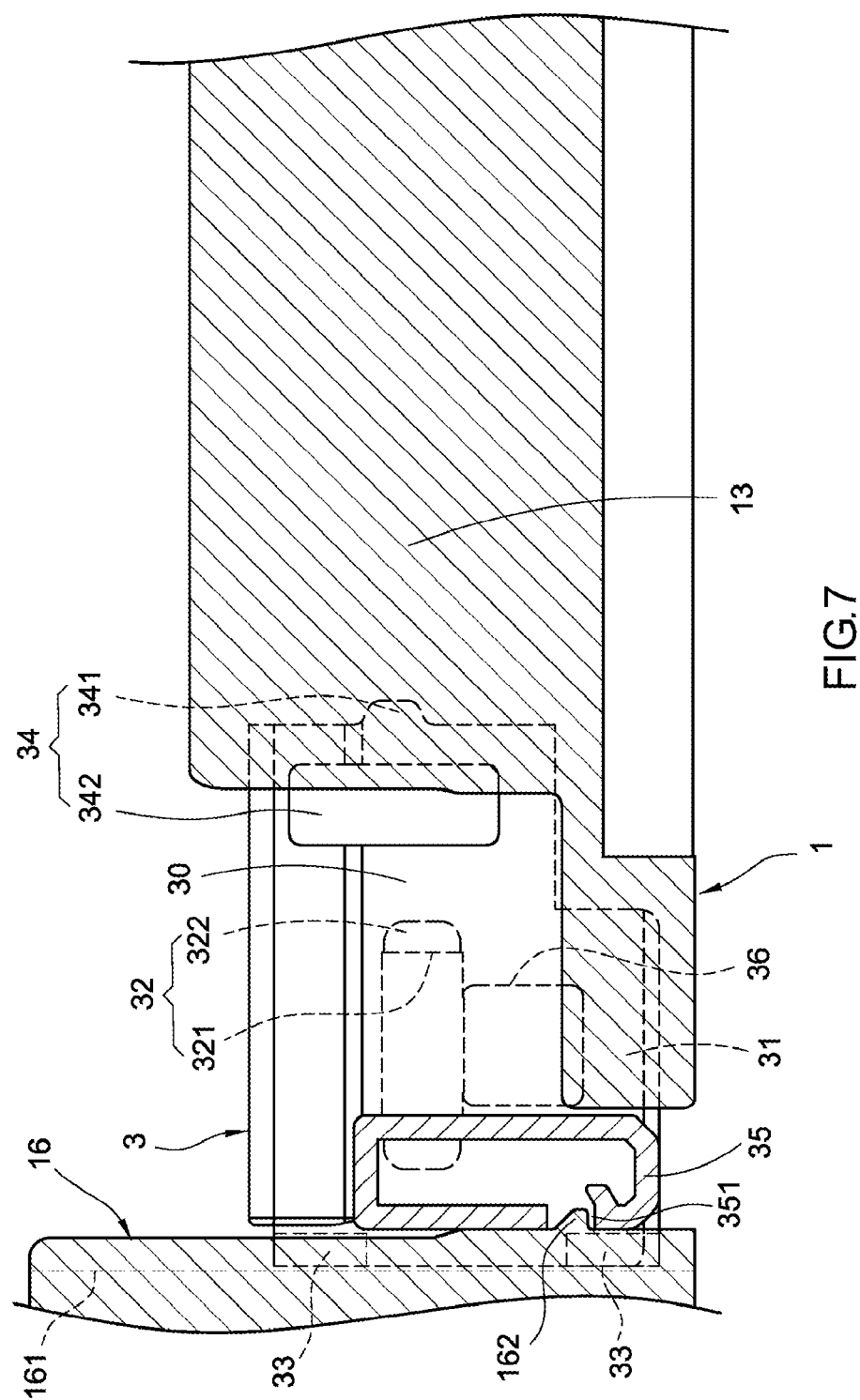
FIG. 7 is yet another perspective schematic diagram of a tenon structure at a locking position according to an embodiment of the present invention.

Details and technical contents of the present invention are given with the accompanying drawings below. It should be noted that the accompanying drawings are only for illustration purposes and are not to be construed as limitations to the present invention.

Referring to FIG. 1 to FIG. 14, the present invention provides a latch mechanism and a tenon structure thereof. The latch mechanism 10 primarily includes a frame 1, a sliding cover plate 2 and a tenon structure 3. The tenon structure 3 primarily includes a body 30, a trigger portion 32 and a fastening rail portion 33.

As shown in FIG. 1 to FIG. 3, FIG. 8 to FIG. 10, FIG. 13 and FIG. 14, the frame 1 is provided with a fastening groove 11 along a first direction d1, a plurality of fastening holes 12 and a recessed channel 13. The recessed channel 13 has a lower inner wall 131, and the fastening groove 11 is formed from the lower inner wall 131 towards a direction away from the recessed channel 13.

Detailed description is given below. The frame 1 has an upper surface 14 and a side surface 15. The plurality of fastening holes 12 are formed at the upper surface 14, and the recessed channel 13 and the fastening groove 11 are formed at the side surface 15.

As shown in FIG. 1 to FIG. 14, the sliding cover plate 2 is connected to the frame 1, and is capable of displacing along a second direction d2 and moving between a first position and a second position, wherein the second direction d2 is perpendicular to the first direction d1. The sliding cover plate 2 has a lower edge 21, and an inner surface of the sliding cover plate 2 is provide with an indentation 22 passing through the lower edge 21 and a hollow opening 23 provided at an inner lower wall of the indentation 22. The sliding cover plate 2 further has a side edge 24.

Further description is given as below. The sliding cover plate 2 includes a connecting plate 25 and a movement plate 26 extending from one side of the connecting plate 25, wherein the connecting plate 25 is connected to the frame 1. The connecting plate 25 and the movement plate 26 are perpendicular and jointly form, for example but not limited to, an L-shaped plate.

The connecting plate 25 is provided with a plurality of strip-shaped holes 251 and a plurality of buried trenches 252 along the second direction d2. Each of the strip-shaped holes 251 is formed from an inner lower wall of each of the buried trenches 252.

The movement plate 26 is capable of sliding at the recessed channel 13. The lower edge 21 of the sliding cover plate 2 is formed on the movement plate 26, and a position of the lower inner wall 131 of the recessed channel 13 is provided correspondingly to a position of the lower edge 21. The indentation 22 and the hollow opening 23 are formed at the movement plate 26. A snap portion 261 protrudes and extends from an outer surface of the movement plate 26.

As shown in FIG. 1 to FIG. 8 and FIG. 10 to FIG. 13, the tenon structure 3 is accommodated in the indentation 22 and is placed between the frame 1 and the sliding cover plate 2, such that the tenon structure 3 is connected to the sliding cover plate 2, moves in the second direction d2 along with the sliding cover plate 2 and is capable of displacing in the first direction d1 relative to the sliding cover plate 2. The tenon structure 3 includes a front latch portion 31 and a trigger portion 32 exposed at the sliding cover plate 2.

When the sliding cover plate 2 moves to the second position, the trigger portion 32 drives the front latch portion 31 along the first direction d1 to be inserted and fitted in the fastening groove 11. The indentation 22 has an inner side wall 221 provided opposite to the side edge 24, and the inner side wall 221 is provided with a notch 222.

An example is given below to more specifically understand the implementation details of the first position and the second position. When the frame 1 is provided with an opening, the first position is a position at which the sliding cover plate 2 opens the opening, and the second position is a position at which the sliding cover plate 2 closes the opening. Thus, the front latch portion 31 is fitted in the fastening groove 11, and the sliding cover plate 2 is locked by the tenon structure 3 and becomes immobile. That is, the first position is an unlocking position, and the second position is a locking position. Alternatively, when the frame 1 is mounted with a detachable component such as a detachable battery, the first position is a position at which the sliding cover plate 2 unlocks the detachable component, and the second position is a position at which the sliding cover plate 2 locks the detachable component. Thus, the front latch portion 31 is fitted in the fastening groove 11, and the sliding cover plate 2 is locked by the tenon structure 3 and is consequently immobile. That is, the first position is an unlocking position, and the second position is a locking position.

Further details are described below. The trigger portion 32 includes a neck portion 321 and a head portion 322 extending outwards from the neck portion 321. A width a of the hollow opening 23 parallel to or measured along the first direction d1 is greater than a width h1 of the neck portion 321 parallel to or measured along the first direction d1, and a width b of the hollow opening 23 parallel to or measured along the second direction d2 is slightly greater than a width h2 of the neck portion 321 parallel to or measured along the second direction d2 and smaller than a width h3 of the head portion 322 parallel to or measured along the second direction d2, such that the neck portion 321 can be smoothly pass through the hollow opening 23 and the neck portion 321 can slide in the first direction d1 at the hollow opening 23. However, the neck portion 321 is stopped and limited in the second direction d2 by the sliding cover plate 2, so as to guide the neck portion 321 to slide in a straight line along the first direction d1. The neck portion 322 protrudes in the second direction d2 from the hollow opening 23 and is stopped and limited by the sliding cover plate 2, so as to prevent the trigger portion 32 from disengaging from the hollow opening 23.

To assemble the tenon structure 3 to the sliding cover plate 2, the tenon structure 3 can be maneuvered to have the part of the head portion 322 that is widest in size to avoid the width of a sliding path s of the hollow opening 23. In this embodiment, the width of the sliding path s is the width b. In other words, the head portion 322 may selectively pass through the hollow opening 23 from other angles. In this embodiment, because the length of a diagonal line of the rectangular hollow opening 23 is the bevel length of two values including the width a and the width b, and the length of the diagonal line is the widest part of the rectangular hollow opening 23. Thus, the part of the head portion 322 that is the widest in size may be first aligned with the diagonal line of the rectangular hollow opening 23, and is then positioned upright after the head portion 322 passes through the hollow opening 23 to cause the stop portion 33 to lean on the side edge 24. Furthermore, during the process of installing the tenon structure 3, the elasticity margin of the material of the tenon structure 3 may be utilized to permit deformation between the head portion 322 and the stop portion 33.

In conclusion, with the matching sizes of the hollow opening 23 and the head portion 322 as well as the elasticity of the tenon structure 3, the tenon structure 3 may utilize the head portion 322 and two stop portions 33 to respectively fit on the hollow opening 23 and the side edge 24 of the sliding cover plate 2. Thus, even if the tenon structure 3 is allowed to slide in the hollow opening 23, the integrally formed tenon structure 3 can still be securely installed at the sliding cover plate 2. Furthermore, because the tenon structure 3 is placed between the frame 1 and the sliding cover plate 2, it is ensured that the single-piece tenon structure 3 installed at the sliding cover plate 2 does not fall off under the premise that the tenon structure 3 remains slidable.

The single-piece tenon structure 3 installed at the sliding cover plate 2 can utilize the head portion 322 and two stop portions 33 to respectively slide on the hollow opening 23 and the side edge 24. In other words, the tenon structure 3 takes the hollow opening 23 and the side edge 24 as tracks and slide thereon. As such, the tenon structure 3 can slide in the indentation 22 and drive the front latch portion 31 to protrude from or be received at the lower edge 21. The trigger portion 32 passes through and is exposed at the hollow opening 23 to be readily operated by a user.

Furthermore, the head portion 322 of this embodiment is, for example but not limited to, a conic body. When the head portion 322 is a conic body, the head portion 322 can smoothly pass through the hollow opening 23 by tilting at an angle to the front, back, left and right.

In addition, one or a plurality of fastening rail portions 33 may extend from one side of the tenon structure 3 and a touch feedback structure 34 may be provided on the other side. The fastening rail portion 33 is provided correspondingly to the side edge 24 and mutually stops and limits the side edge 24. When the front latch portion 31 is fitted in the fastening groove 11, the touch feedback structure 34 is simultaneously fitted at the notch 222 and makes a snapping sound to remind that the front latch portion 31 is fitted in the fastening groove 11, i.e., reminding that the sliding cover plate 2 is locked by the tenon structure 3 and is thus immobile.

The configuration of the tenon structure 3 of the present invention may also be illustrated from another perspective. The tenon structure 3 is adapted to be assembled to the hollow opening 23 and the side edge 24 of a sliding cover plate 2, so as to slide between a locking position and an unlocking position and define a sliding path s.

An example is given below to specifically understand implementation details of the locking position and the unlocking position. The locking position is a position at which the sliding cover plate 2 is locked by the tenon structure 3 and is immobile, and the unlocking position is a position at which the sliding cover plate 2 is not locked by the tenon structure 3 and is mobile.

In this embodiment, the tenon structure 3 is a plastic member formed integrally. The tenon structure 3 includes a body 30, a front latch portion 31, a trigger portion 32, two fastening rail portions 33, a touch feedback structure 34 and a rear latch portion 35 that all integrally extend form the body 30. However, in other embodiments, a part of the tenon structure 3 may be additionally assembled to the body 30, wherein the front latch portion 31 extends downwards from the plate-like body 30; alternatively, the front latch portion 31 is formed by a lower edge structure of the body 30. In this embodiment, the front latch portion 31 and the touch feedback structure 34 jointly form an L-shaped slot, wherein the front latch portion 31 exactly corresponds to the fastening groove 11. The trigger portion 32 extends forward from the plate-like body 30, and two fastening rail portions 33 similarly extend forward from the plate-like body 30. The tenon structure 3 takes the part of the hollow opening 23 near the side edge 24 as a track, and is installed on the sliding cover plate 2 by the trigger portion 32 and two fastening rail portions 33 respectively located on two sides of the track. On the basis of a principle that three points determine a plane, the position relationship between the tenon structure 3 and the sliding cover plate 2 is confirmed, but at least one dimensional degree of freedom for displacement is still reserved; that is, the tenon structure 3 can slide along the track. In this embodiment, the tenon structure 3 linearly slides along the sliding cover plate 2. However, in other embodiments, the sliding path s of the tenon structure 3 is not limited.

The trigger portion 32 utilizes a neck portion 321 to slide in the hollow opening 23 along the sliding path s, wherein the width b of the hollow opening 23 measured perpendicularly to the sliding path s matches the width h2 of the neck portion 321 measured perpendicularly to the sliding path s. The trigger portion 32 then utilizes a head portion 322 to abut against an outer side of the hollow opening 23, wherein the head portion 322 extends outwards from the neck portion 321. Furthermore, the width h3 of the head portion 322 measured perpendicularly to the sliding path s is greater than the width b of the hollow opening 23 measured perpendicularly to the sliding path s.

Figure 9:
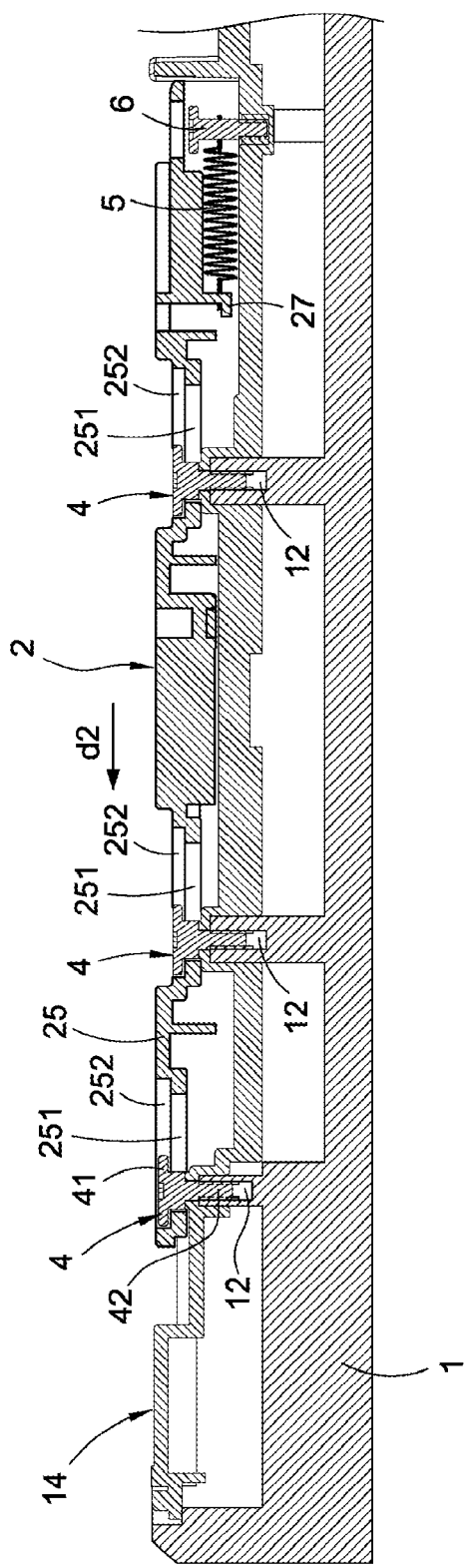
FIG. 9 is a schematic diagram of a section of a latch mechanism according to an embodiment of the present invention.
Figure 10:
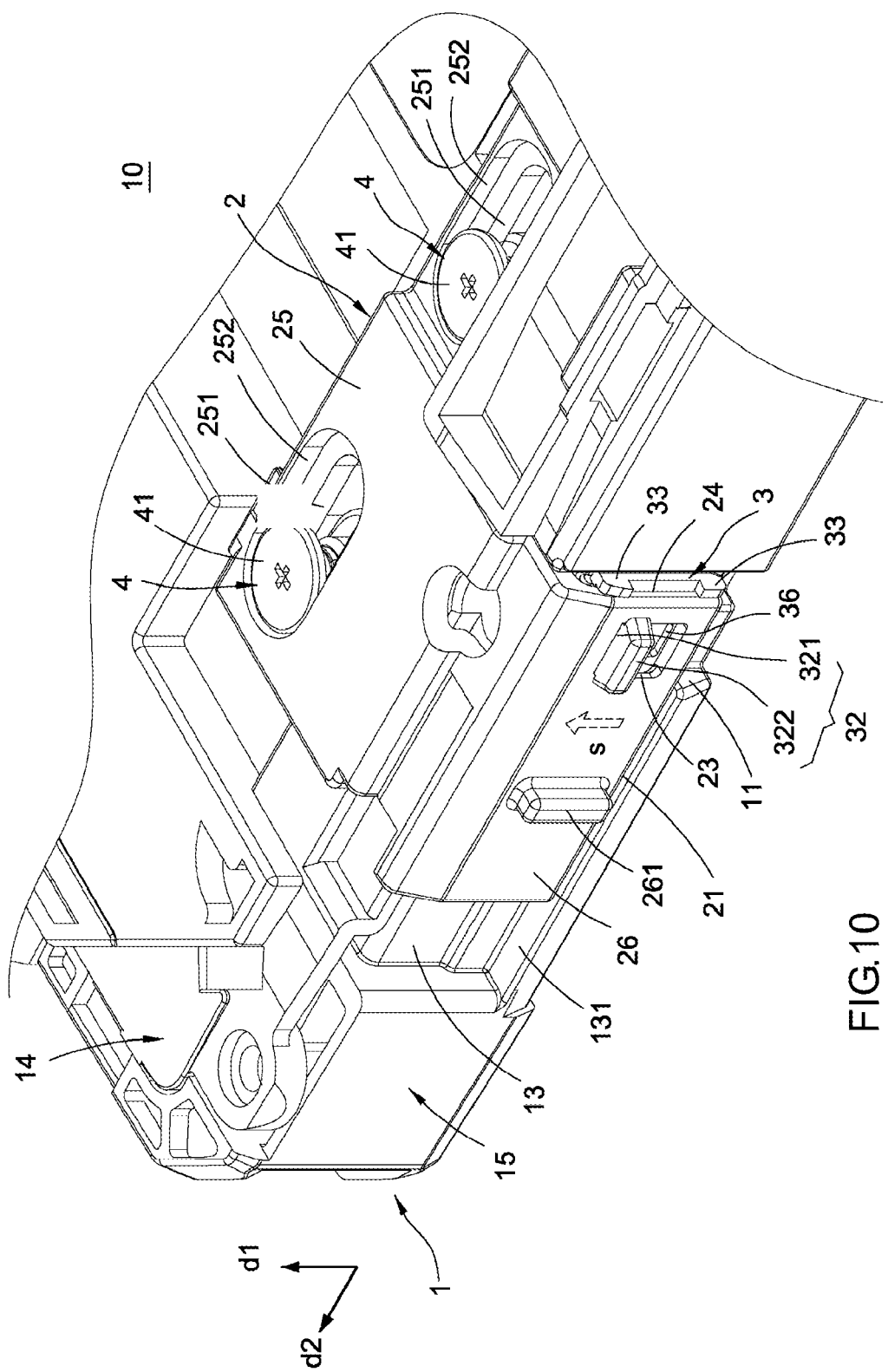
FIG. 10 is a schematic diagram of a state of use of a latch mechanism according to an embodiment of the present invention.
Figure 11:
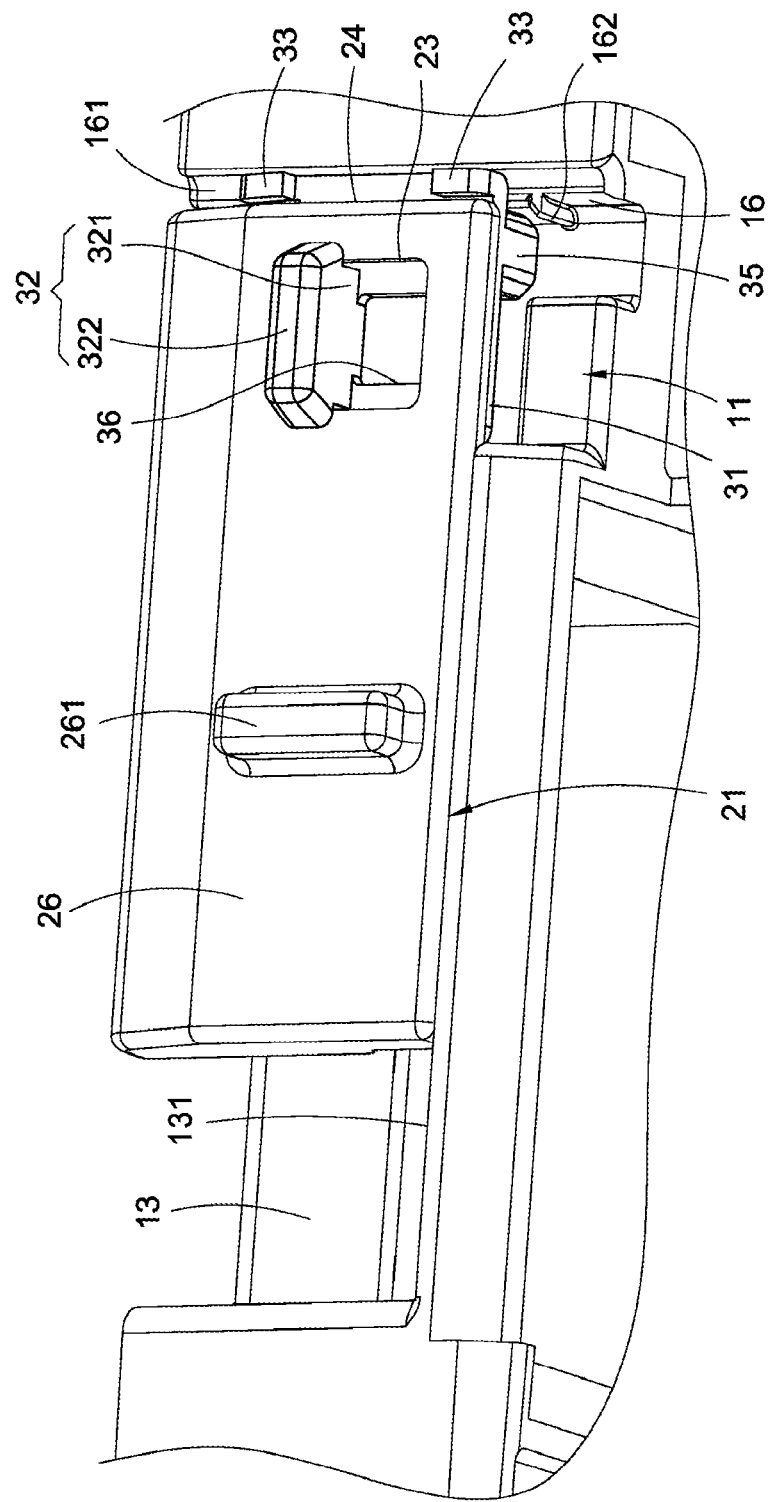
FIG. 11 is a perspective schematic diagram of a tenon structure at an unlocking position according to an embodiment of the present invention.
Figure 12:
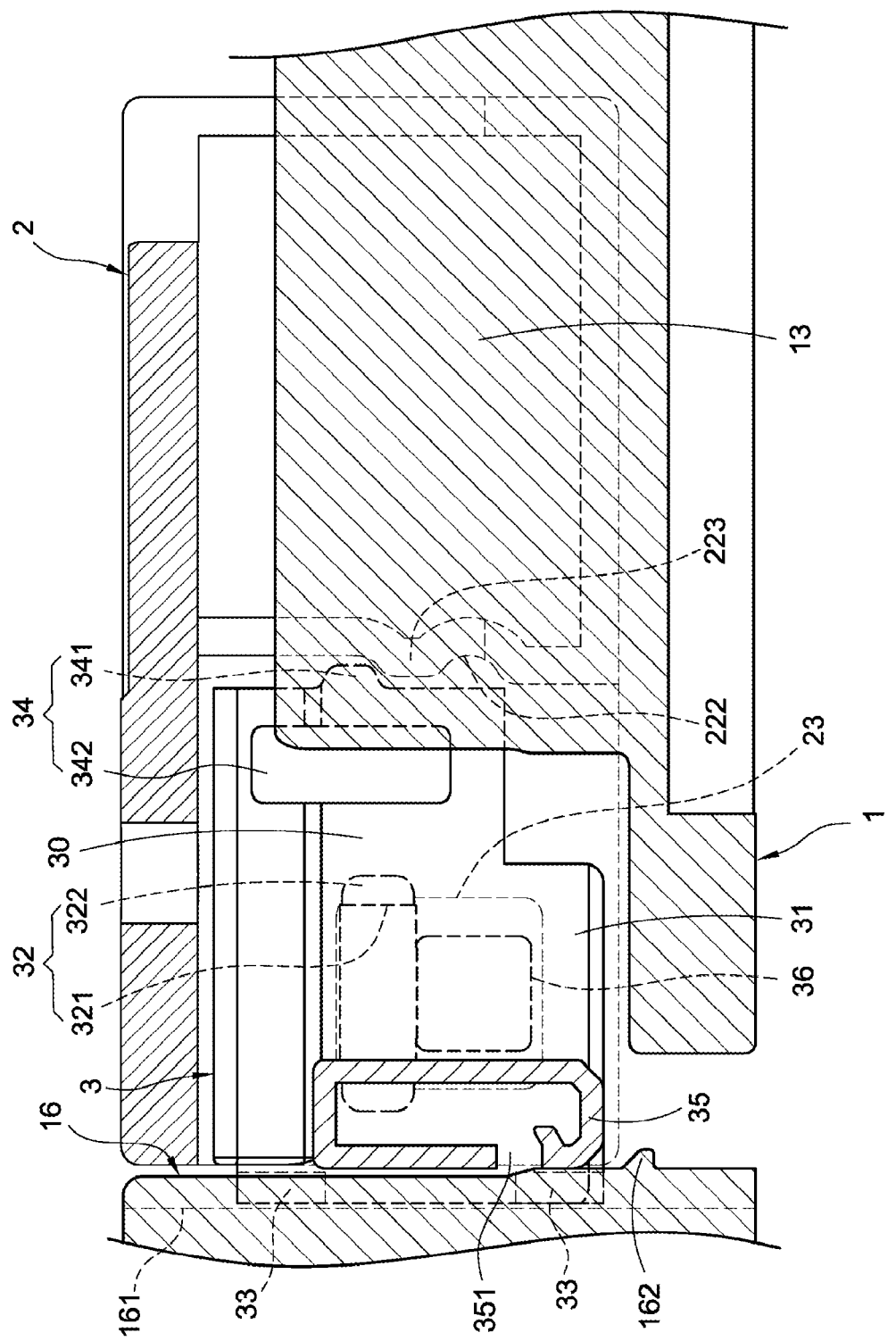
FIG. 12 is another perspective schematic diagram of a section of a tenon structure at an unlocking position according to an embodiment of the present invention.
Figure 13:
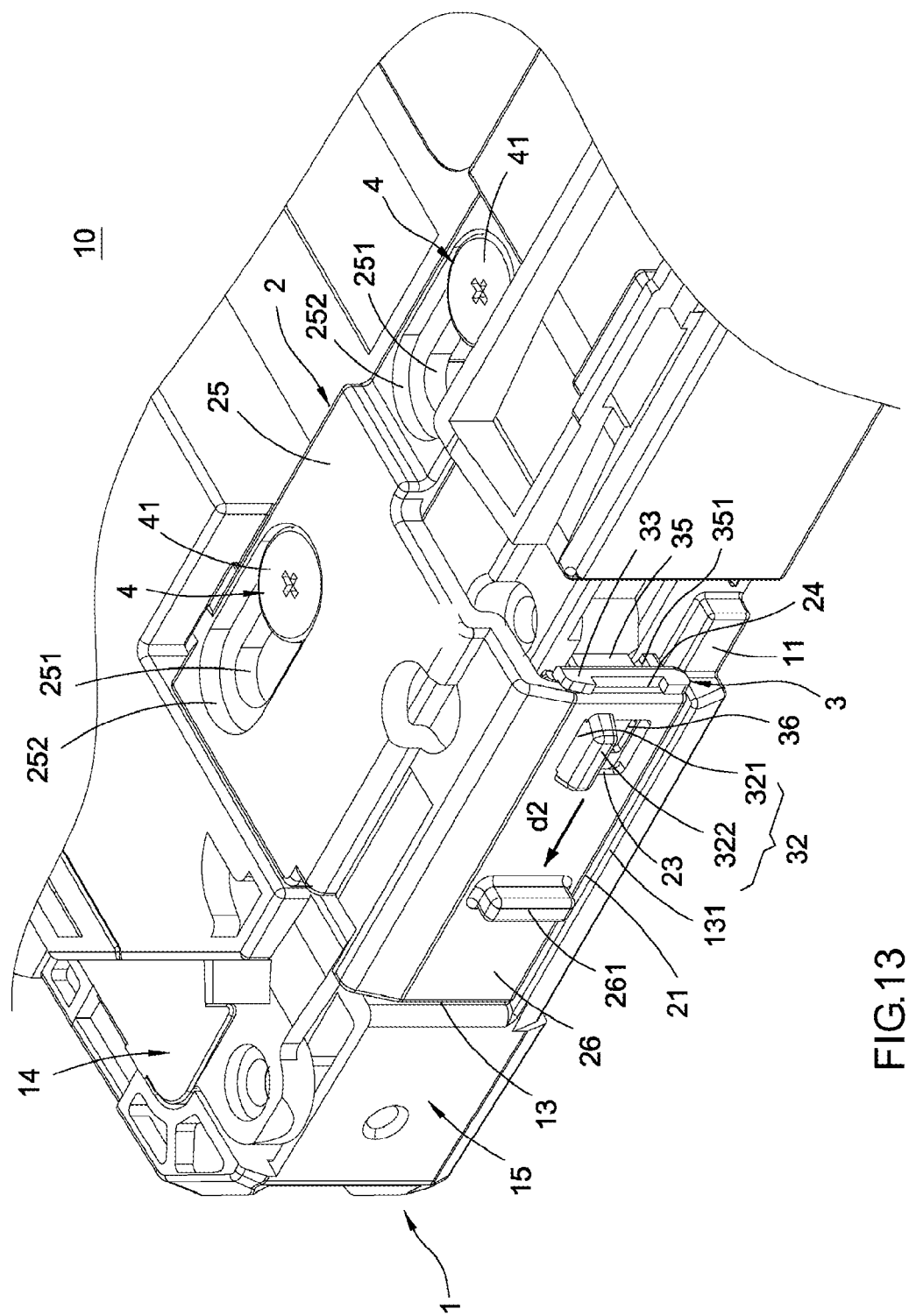
FIG. 13 is another schematic diagram of a state of use of a latch mechanism according to an embodiment of the present invention.
Figure 14:
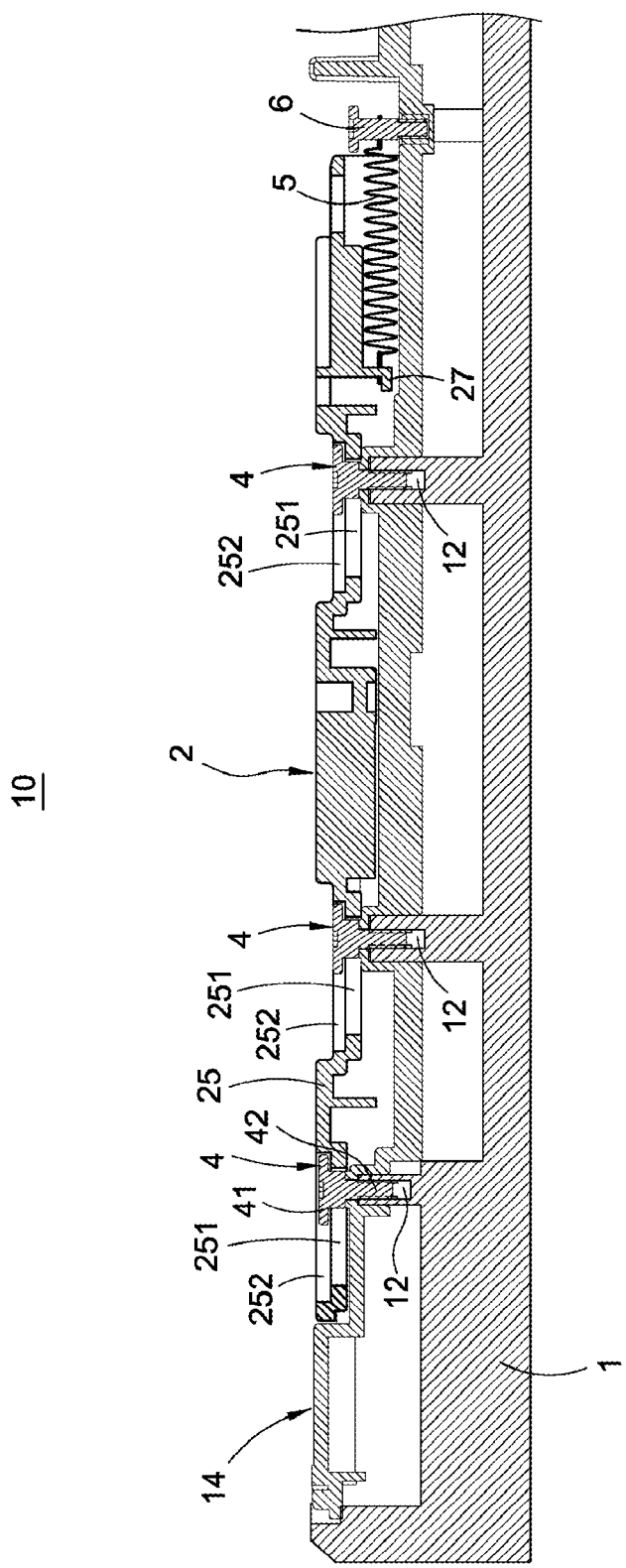
FIG. 14 is a schematic diagram of another section of a latch mechanism according to an embodiment of the present invention.

Moreover, the fastening rail portion 33 extends from the body 30 and is provided correspondingly to the side edge 24. The tenon structure 3 utilizes the trigger portion 32 and the fastening rail portion 33 to respectively abut against and slide at the hollow opening 23 and the side edge 24 of the sliding cover plate 2. The touch feedback structure 34 includes a touch protrusion 341 extending from the tenon structure 3 and a weakening opening 342 provided from the tenon structure 3. The touch protrusion 341 extends outwards from one horizontal side of the plate-like body 30. When the tenon structure 3 linearly slides back and forth, the touch feedback structure 34 uses the touch protrusion 341 to repeatedly cross a positioning protrusion 223 correspondingly provided at the sliding cover plate 2 to provide the touch feedback of fastening positioning. Furthermore, when the two protrusions interfere each other, the touch feedback structure 34 utilizes the weakening opening 342 to allow the touch feedback structure 34 to deform at the touch protrusion 341, so as to have the touch protrusion 341 to easily cross the positioning protrusion 223 correspondingly provided at the sliding cover plate 2. As shown in FIG. 1, FIG. 9, and FIG. 14, the latch mechanism 10 of the present invention further includes a plurality of screws 4, and each screw 4 has a lock head 41 and a screw rod 42. Each screw rod 42 passes through each fastening hole 12 and each strip-shaped hole 251, and each lock head 41 and the connecting plate 25 stop and limit each other. Thus, the connecting plate 25 can displace in the second direction d2 through the plurality of strip-shaped holes 251 relative to the plurality of screws 4, and the lock heads 41 are buried in the buried trenches 252.

As shown in FIG. 4, and FIG. 9 to FIG. 14, the latch mechanism 10 of the present invention further includes a restoring spring 5, and a protruding column 27 extends from the sliding cover plate 2. One end of the restoring spring 5 is sleeved around the protruding column 27 and the other end is fixed at the frame 1 through a fastening element 6, such that the restoring spring 5 is placed between the frame 1 and the sliding cover plate 2, and the restoring spring 5, when not receiving any force, drives the sliding cover plate 2 to move to an elastic restoring position of the restoring spring 5.

Figure 8:
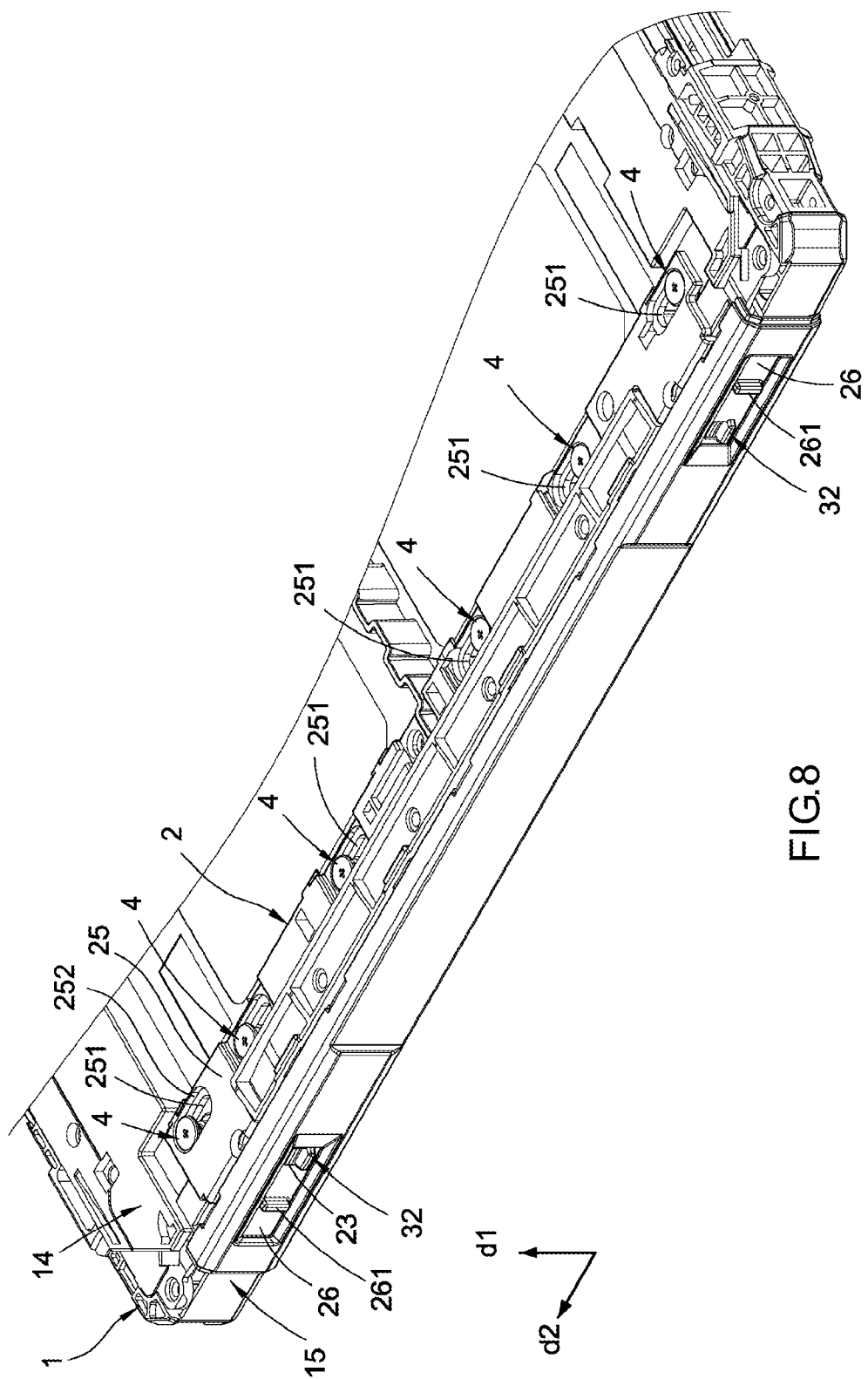
FIG. 8 is another perspective assembly diagram of a latch mechanism according to an embodiment of the present invention.

Furthermore, as shown in FIG. 8, the sliding cover plate 2 and the tenon structure 3 in this embodiment are respectively two in quantity, and are respectively configured at two ends of the frame 1, for example but not limited to. The sliding cover plate 2 and the tenon structure 3 in this embodiment may be one or plural in quantity, and the sliding cover plate 2 and the tenon structure 3 may be jointly mounted at any desired position on the frame 1.

As shown in FIG. 1 and FIG. 5 to FIG. 14, in a state of use of the latch mechanism 10 and the tenon structure 3 of the present invention, the tenon structure 3 is installed by utilizing the sliding cover plate 2. As shown in FIG. 1 and FIG. 5 to FIG. 9, when the sliding cover plate 2 moves to the second position, the trigger portion 32 can drive the front latch portion 31 along the first direction d1 to be inserted and fitted in the fastening groove 11, such that the sliding cover plate 2 is locked by the tenon structure 3 and becomes immobile, rendering the sliding cover plate 2 to be in a state of closing an entrance or locking a detachable component, as described above. As shown in FIG. 10 to FIG. 14, when the front latch portion 31 disengages from the fastening groove 11, because the sliding cover plate 2 is not locked by the tenon structure 3 and is mobile, the restoring spring 5 at the same time drives the sliding cover plate 2 to move to the first position (the elastic restoring position of the restoring spring 5), such that the sliding cover plate 2 is in a state of opening an entrance or unlocking a detachable component, as described above.

Furthermore, the tenon structure 3, by utilizing the size differences among the neck portion 321, the head portion 322 and the hollow opening 23 as well as the simple structure of abutting the trigger portion 32 and the fastening rail portion 33 against and sliding at the hollow opening 23 and the side edge 24 of the sliding cover plate 2 respectively, can be guided to linearly slide along the first direction d1 and drive the front latch portion 31 to fit in the fastening groove 11, achieving the object of locking the sliding cover plate 2 by the tenon structure 3 and keeping the sliding cover plate 2 immobile, and further accomplishing effects of simplifying the components of the tenon structure 3, preventing the sliding cover plate 2 from being opened due to an unintentional trigger, vibration or collision, providing a simple assembly structure, reducing accommodation space and reducing production costs.

Referring to FIG. 5 to FIG. 7 and FIG. 10 to FIG. 14, the trigger portion 32 extends from one side of the tenon structure 3 and a rear latch portion 35 extends from the other side. The rear latch portion 35 extends backwards from the plate-like body 30. In this embodiment, to satisfy physical limitations of injection molding, the rear latch portion 35 adopts an even and thick C-shaped or G-shaped structure, and a yielding opening 351 is formed through the breach of the C-shaped or G-shaped structure. When the front latch portion 31 and the rear latch portion 35 are accommodated in the fastening groove 11, a sliding wall 16 is provided with a spike 162 extending and protruding correspondingly to the yielding opening 351. The spike 162 may slide along a guide corner at a lower edge of the C-shaped or G-shaped structure of the rear latch portion 35 to the yielding opening 351 and be fitted in the yielding opening 351. However, in other embodiments, the specific shape of the rear latch portion 35 is not limited.

In this embodiment, a sliding wall 16 is provided next to the fastening groove 11 of the frame 1, and one side of the tenon structure 3 relative to the touch feedback structure 34 can slide along the sliding wall 16. The sliding wall 16 is further provided with a sliding channel 161 disposed correspondingly to an outer side of the fastening rail portion 33. The tenon structure 3 can utilize two fastening rail portions 33 to lean in the sliding channel 161, thereby increasing the stability of the linear sliding movement. In addition, one side of the C-shaped or G-shaped rear latch portion 35 of the tenon structure 3 may similarly slide along the sliding wall 16, and the tenon structure 3 can utilize the rear latch portion 35 to lean against the sliding wall 16, thereby increasing the stability of the linear sliding movement. A lower edge of the rear latch portion 35 is aligned with a lower edge of the front latch portion 31, and the fastening groove 11 corresponding to the front latch portion 31 and the rear latch portion 35 is provided at the frame 1.

When the tenon structure 3 is leaned against the sliding wall 16 and the fastening groove 1 accommodates the front latch portion 31 and the rear latch portion 35, the tenon structure 3 can exercise the function of locking to prohibit the sliding cover plate 2 from sliding. At this point in time, if the sliding cover plate 2 is forcibly slid, the tenon structure 3 may be caused to rotate and deviate from the track. However, the spike 162 of the frame 1 provided correspondingly to the yielding opening 351 is already located in the yielding opening 351 and holds one end of the C-shaped or G-shaped structure, one side of the C-shaped or G-shaped rear latch portion 35 is leaned against the sliding wall 16, and the two fastening rail portions 33 are abutted in the sliding channel 161. Thus, the dislocation between the frame 1 and the sliding cover plate 2 causing the rotation and deviation of the tenon structure 3 is prevented, and thereby enhancing the overall stability of the latch mechanism 10.

In this embodiment, the body 30 of the tenon structure 3 is provided therein with a niche 36 to provide an eye-catching reminding function, e.g., filling red ink or embedding a red brick. When the tenon structure 3 is located at the unlocking position, the niche 36 is revealed from the hollow opening 23, thus reminding a user that the sliding cover plate 2 is not yet locked.

In conclusion, the latch mechanism and the tenon structure thereof of the present invention neither are disclosed in similar products and nor have been publicly used, and are industrially applicable, novel and involve an inventive step, which meet the requirements of a patent application. Therefore, a patent application is filed accordingly, and granting the application with patent rights is respectfully requested to ensure rights of the Inventor.

What is claimed is:

1. A tenon structure, adapted to be assembled to a hollow opening and a side edge of a sliding cover plate, the tenon structure comprising:
   a body;
   a trigger portion, extending from the body and provided correspondingly to the hollow opening; and
   a fastening rail portion, extending from the body and provided correspondingly to the side edge;
   wherein the tenon structure utilizes the trigger portion and the fastening rail portion to respectively abut against and slide at the hollow opening and the side edge of the sliding cover plate.

2. A latch mechanism, comprising:
   a frame, provided with a fastening groove along a first direction;
   a sliding cover plate, connected to the frame, capable of displacing along a second direction and moving between a first position and a second position, wherein the first direction is perpendicular to the second direction; and
   a tenon structure, connected to the sliding cover plate, the tenon structure moving in the second direction along with the sliding cover plate and capable of displacing in the first direction relative to the sliding cover plate, the tenon structure comprising a front latch portion and a trigger portion exposed at the sliding cover plate;
   wherein, when the sliding cover plate moves to the second position, the trigger portion drives the front latch portion along the first direction to be inserted and fitted in the fastening groove.

3. The latch mechanism according to claim 2, wherein the sliding cover plate has a lower edge, an inner surface of the sliding cover plate is provided with an indentation passing through the lower edge, a hollow opening is provided at an inner lower wall of the indentation, the tenon structure is accommodated in the indentation and is placed between the frame and the sliding cover plate, the tenon structure is capable of sliding in the indentation and driving the front latch portion to protrude from or be received at the lower edge, and the trigger portion passes through and is exposed at the hollow opening.

4. The latch mechanism according to claim 3, wherein the trigger portion comprises a neck portion and a head portion extending outwards from the neck portion, a width of the hollow opening along the first direction is greater than a width of the neck portion along the first direction, a width of the hollow opening along the second direction is slightly greater than a width of the neck portion along the second direction and smaller than a width of the head portion along the second direction, such that the neck portion is allowed to be inserted at the hollow opening, the neck portion slides in the first direction at the hollow opening and is stopped and limited in the second direction by the sliding cover plate, the head portion protrudes in the second direction from the hollow opening and is stopped and limited by the sliding cover plate, and the head portion is a conic body.

5. The latch mechanism according to claim 4, wherein the sliding cover plate has a side edge, at least one fastening rail portion extends from one side of the tenon structure, and the fastening rail portion is provided correspondingly to the side edge and mutually stops and limits the side edge.

6. The latch mechanism according to claim 5, wherein the indentation has an inner side wall provided opposite to the side edge, the inner side wall is provided with a notch and a positioning protrusion extending therefrom, one other side of the tenon structure is provided with a touch feedback structure, the touch feedback structure comprises a touch protrusion extending from the tenon structure and a weakening opening provided from the tenon structure, and the touch protrusion utilizes the weakening opening to deform and cross the positioning protrusion and be fitted in the notch when the front latch portion is fitted in the fastening groove.

7. The latch mechanism according to claim 6, wherein a rear latch portion extends from the tenon structure and the rear latch portion is provided with a yielding opening, the frame is provided with a sliding wall next to the fastening groove, the sliding wall is provided with a sliding channel and a spike extends therefrom, the fastening rail portion is leaned against and slides in the sliding channel, and the spike slides along the rear latch portion and is fitted in the yielding opening when the front latch portion is fitted in the fastening groove.

8. The latch mechanism according to claim 7, further comprising a restoring spring that is placed between the frame and the sliding cover plate; wherein the sliding cover late comprises a connecting plate and a movement plate extending from one side of the connecting plate, the connecting plate is connected to the frame, the lower edge is formed on the movement plate, the indentation and the hollow opening are formed from the movement plate, and a snap portion protrudes and extends from an outer surface of the movement plate.

9. The latch mechanism according to claim 8, further comprising a plurality of screws, each of which has a lock head and a screw rod; wherein the frame is provided with a plurality of fastening holes, the connecting plate is provided with a plurality of strip-shaped holes along the second direction, each of the screw rods is inserted into each of the fastening holes and each of the strip-shaped holes, each of the lock heads mutually stops and limits the connecting plate such that the connecting plate is capable of displacing in the second direction through the plurality of strip-shaped holes relative to the plurality of screws, the connecting plate is provided with a plurality of buried trenches, each of the strip-shaped holes is formed from an inner lower wall of each of the buried trenches, and each of the lock heads is buried in each of the buried trenches.

10. The latch mechanism according to claim 9, wherein the frame is provided with a recessed channel, and an upper surface and a side surface, the movement plate is capable of sliding at the recessed channel, the recessed channel has a lower inner wall provided correspondingly to the lower edge, the fastening groove is formed from the lower inner wall towards a direction away from the recessed channel, the plurality of fastening holes are formed from the upper surface, the recessed channel and the fastening groove are formed from the side surface, and the connecting plate and the movement plate are perpendicular and jointly form an L-shaped plate.

* * * * *